United States Patent
Gumbrecht et al.

(10) Patent No.: US 11,428,767 B2
(45) Date of Patent: Aug. 30, 2022

(54) COMPUTER-IMPLEMENTED METHOD FOR PROVIDING AN ACTUATION SEQUENCE AND METHOD FOR ACQUIRING MEASUREMENT DATA BY A MAGNETIC RESONANCE DEVICE

(71) Applicant: Siemens Healthcare GmbH, Erlangen (DE)

(72) Inventors: Rene Gumbrecht, Herzogenaurach (DE); Jürgen Herrler, Erlangen (DE); Patrick Liebig, Erlangen (DE); Armin Nagel, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/068,420

(22) Filed: Oct. 12, 2020

(65) Prior Publication Data

US 2021/0109178 A1 Apr. 15, 2021

(30) Foreign Application Priority Data

Oct. 14, 2019 (EP) .................................... 19202976

(51) Int. Cl.
*G01V 3/00* (2006.01)
*G01R 33/54* (2006.01)
(Continued)

(52) U.S. Cl.
CPC ......... *G01R 33/543* (2013.01); *G01R 33/243* (2013.01); *G01R 33/246* (2013.01); *G01R 33/3852* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

2008/0231274 A1 9/2008 Fontius
2014/0292333 A1* 10/2014 Beck .................. G01R 33/543
324/309

(Continued)

FOREIGN PATENT DOCUMENTS

DE 102007013422 B4 5/2010
WO 2017060142 A1 4/2017

OTHER PUBLICATIONS

Cloos, M. A., et al. "kT-points: short three-dimensional tailored RF pulses for flip-angle homogenization over an extended volume." Magnetic Resonance in Medicine 67.1 (2012): 72-80.
(Continued)

*Primary Examiner* — Walter L Lindsay, Jr.
*Assistant Examiner* — Frederick Wenderoth
(74) *Attorney, Agent, or Firm* — Lempia Summerfield Katz LLC (57) ABSTRACT

A computer-implemented method is disclosed for providing an actuation sequence which specifies transmit signals for at least one high-frequency transmit channel of an antenna arrangement of a magnetic resonance device for acquiring measurement data of an object under investigation by the magnetic resonance device. The method includes providing different actuation sequences, wherein each sequence is the result of an optimization method and which differs with regard to the value of an optimization parameter taken into account in the course of the optimization method. The method further includes providing a plurality of field distribution maps, (e.g., at least one $B_0$ map and/or at least one $B_1$ map), acquired by the or a further magnetic resonance device from the object under investigation. The method further includes selecting the actuation sequence to be used from the different actuation sequences depending on the
(Continued)

field distribution maps and providing the actuation sequence to be used.

18 Claims, 4 Drawing Sheets

(51) Int. Cl.
    *G01R 33/24*     (2006.01)
    *G01R 33/385*     (2006.01)

(58) Field of Classification Search
    USPC .......................................................... 324/309
    See application file for complete search history.

(56) References Cited

U.S. PATENT DOCUMENTS

| | | |
|---|---|---|
| 2018/0011155 A1 | 1/2018 | Ito |
| 2018/0024215 A1* | 1/2018 | Zhu .................... G01R 33/5608 324/309 |
| 2018/0252788 A1 | 9/2018 | Boulant |

OTHER PUBLICATIONS

Eichfelder, Gabriele, and Matthias Gebhardt. "Local specific absorption rate control for parallel transmission by virtual observation points." Magnetic resonance in medicine 66.5 (2011): 1468-1476.

European Search Report for European Application No. 19202976.7-1010 dated May 12, 2020.

Graesslin, Ingmar, et al. "A specific absorption rate prediction concept for parallel transmission MR." Magnetic resonance in medicine 68.5 (2012): 1664-1674.

Gras, Vincent, et al. "Universal pulses: a new concept for calibration-free parallel transmission." Magnetic resonance in medicine 77.2 (2017): 635-643.

Van Den Bergen, Bob, et al. "7 T body MRI: B1 shimming with simultaneous SAR reduction " Physics in Medicine & Biology 52.17 (2007): 5429-5441.

Zhang, Xiaotong, et al. "Complex B1 mapping and electrical properties imaging of the human brain using a 16-channel transceiver coil at 7T." Magnetic resonance in medicine 69.5 (2013): 1285-1296.

* cited by examiner

COMPUTER-IMPLEMENTED METHOD FOR PROVIDING AN ACTUATION SEQUENCE AND METHOD FOR ACQUIRING MEASUREMENT DATA BY A MAGNETIC RESONANCE DEVICE

The present patent document claims the benefit of European Patent Application No. 19202976.7, filed Oct. 14, 2019, which is hereby incorporated by reference.

TECHNICAL FIELD

The disclosure relates to a computer-implemented method for providing an actuation sequence to be used which specifies transmit signals to be emitted for at least one high-frequency transmit channel, (e.g., for a plurality of high-frequency transmit channels), of an antenna arrangement of a magnetic resonance device for acquiring measurement data from an object under investigation by the magnetic resonance device. The disclosure additionally relates to a method for acquiring measurement data from an object under investigation by a magnetic resonance device, to a provision and/or magnetic resonance device, to a computer program, and to a computer-readable data storage medium.

BACKGROUND

It may be advantageous in the field of magnetic resonance imaging to make use of high magnetic field strengths of the main magnet in order to achieve high image quality from the result data. For example, a static magnetic flux density of approx. 7 tesla is used for ultra-high-field magnetic resonance tomography. Such high field strengths of the main magnetic field $B_0$ require relatively high-frequency excitation pulses with a frequency of approx. 300 MHz in order to excite spins in the body of the object under investigation. The wavelength of such an electromagnetic wave in biological tissue is very short, namely in the region of approx. 13 cm. The relatively good tissue conductance for high frequencies and reflections at boundary surfaces between different biological tissues or biological tissue and air may give rise to severe nonuniformities in the excitation field. Because high static field strengths of the $B_0$ field are used, even relatively small relative differences may lead to large absolute differences in field strength and thus to distinctly differing Larmor frequencies between different regions of the object under investigation.

In high-field imaging, the stated points may result in some regions of the object under investigation being only very slightly excited and thus also generating scarcely measurable signals. In addition, a nonuniform flip angle, which is disadvantageous with regard to imaging, may be obtained in the region in question.

If magnetic resonance tomography at such high field strengths is to be clinically usable, it is therefore necessary to identify a simple, (e.g., integrated solution for rendering the flip-angle distribution uniform), it being desirable to avoid excessively long measurement and/or computing times being required or such an apparatus only being able to be operated with high levels of technical knowledge on the part of users.

More uniform excitation may be achieved by sampling a transmit k-space in order to achieve spatial encoding of the $B_1$ field, e.g., of the high-frequency field used for spin excitation. The high-frequency $B_1$ field may thus be applied more strongly or for longer in regions in which weaker signals are anticipated. Using individual transmit antennas in such a procedure requires relatively long transmit pulses, which may lead to high specific absorption rates (SAR) or specific energy doses (SED), so possibly making application to living objects under investigation, in particular patients, problematic. This may be avoided by using the "parallel excitation" (pTx) principle in which a plurality of transmit antennas are used as high-frequency coils in order to excite spins in the object under investigation. The simultaneous actuation of a plurality of such coils with k-space sampling by actuation of gradient coils proceeding simultaneously or between actuations is also known as a pTx pulse.

With regard to such excitation, static RF shimming or $B_1$ shimming is the closest to being clinically applicable. This involves assigning individual amplitudes and phases to each coil while maintaining a fixed and uniform pulse shape in order to render the overall $B_1$ field generated uniform during excitation. Amplitudes and phases may be calculated with the assistance of the previously acquired transmit coil profiles, e.g., a $B_1$ map, and a $B_0$ map.

A potential further improvement may be achieved by dynamic RF shimming or flip-angle shimming which is, however, currently not yet used in clinical application. This involves optimization at the end of excitation with regard to a flip-angle distribution which is to be achieved, with differing and individually nonuniform $B_1$ field distributions being permitted during excitation. A dedicated pulse shape is here in each case calculated for the individual excitation coils and the k-space is simultaneously sampled along a trajectory. It would in principle be possible in each case to optimize the actuation sequence used for excitation for the specific object under investigation. While this would indeed potentially provide the best results, it is associated with relatively long data transfer and computing times of approximately five minutes and is thus scarcely usable in day-to-day clinical practice.

An alternative, which is directed toward clinical applicability because it may be used without any calibration for the individual object under investigation and therefore without additional delay, is to use "universal pulses". This involves performing optimization for a cohort of reference objects under investigation and then using the pulses, once optimized, without further calibration for all objects under investigation. Details of this approach are disclosed, for example, by document WO 2017/060142 A1 or the article by Grass, V. (2017), "Universal Pulses: A new concept for calibration-free parallel transmission", Magnetic Resonance in Medicine 77:635-643. The trajectory used for sampling the k-space is here based on the "$k_T$ point" principle which is discussed, for example, in the article by Cloos, M. A., et al. (2012), "$k_T$ Points: Short three-dimensional tailored RF-pulses for flip-angle homogenization over an extended volume", Magnetic Resonance in Medicine 67:72-80. This involves transmitting a rectangular pulse with a specific amplitude and phase at various calculated points in the k-space. The drawback of using universal pulses is that under certain constraints, (e.g., at a maximum admissible specific absorption rate), the same image quality may not be achieved as would be possible with an individually optimized actuation sequence.

One constraint may be specified in the course of optimizing actuation sequences is that certain specific absorption rates are not exceeded. One approach to predicting specific absorption rates for pTx pulse sequences is discussed in the article by Graesslin, I. et al. (2012), "A specific absorption rate prediction concept for parallel transmission MR", Magnetic Resonance in Medicine 68:1664-1674. This involves ascertaining SAR values for specific locations in the object under investigation, thus for example for individual voxels. It may be advantageous to use "virtual observation points" (VOPs) to reduce the computing effort required. In this approach, not necessarily contiguous regions which are anticipated to have similar absorption behavior are combined and a maximum of the specific absorption rate anticipated for the respective regions, namely the virtual observation points, is estimated. Detailed information in this respect is disclosed by the article by Eichfelder, G., et al. (2011), "Local Specific Absorption Rate Control for Parallel Transmission by Virtual Observation Points", Magnetic Resonance in Medicine 66:1468-1476.

Energy input may be estimated using body models which describe the conductivity and electrical permeability of differing regions of the body. One approach to obtaining corresponding electrical characteristics of the tissue from magnetic resonance device measurement data is known from the article by Zhang, X., et al. (2013), "Complex $B_1$ mapping and electrical properties imaging of the human brain using a 16-channel transceiver coil at 7 T", Magnetic Resonance in Medicine 69:1285-1296.

SUMMARY AND DESCRIPTION

The object underlying the disclosure is thus that of stating a way of further improving achievable image quality in magnetic resonance devices in comparison with the universal pulses discussed above, it being desirable to avoid excessively long measurement or computing times being required for the individual object under investigation, such that in particular there is no excessive extension of investigation time in day-to-day clinical practice.

The scope of the present disclosure is defined solely by the appended claims and is not affected to any degree by the statements within this summary. The present embodiments may obviate one or more of the drawbacks or limitations in the related art.

The object is achieved by a computer-implemented method of the type stated in the introduction. The method includes providing different actuation sequences, each of which is the result of an optimization method and which differ with regard to the value of an optimization parameter taken into account in the course of the optimization method. The method further includes providing a plurality of field distribution maps, in particular at least one $B_0$ map and/or at least one $B_1$ map, acquired by the or a further magnetic resonance device from the object under investigation. The method further includes selecting the actuation sequence to be used from the different actuation sequences depending on the field distribution maps and providing the actuation sequence to be used.

The concept underlying the disclosure is that of carrying out a major part of the optimization in an upstream optimization method. This may be independent of the characteristics of the object under investigation and in particular independent of the field distribution maps acquired from the object under investigation. The actuation sequences may be provided before the start of the method and in particular before any imaging has been performed on the object under investigation, (e.g., as early as during manufacture or in the course of a normal update of the magnetic resonance device or another provision device which carries out the computer-implemented method).

In order to allow account to be taken of the characteristics of the specific object under investigation, a plurality of different actuation sequences are provided, from which an actuation sequence to be used is selected depending on the characteristics, (e.g., the field distribution maps), of the object under investigation. As will be explained in greater detail below, the optimization parameter may specify the extent to which the focus of optimization is, on the one hand, on reducing the energy input into the object under investigation and, on the other hand, on optimally achieving a nominal excitation distribution, e.g., a specified distribution of flip angles. Based on the characteristics of the object under investigation, it is then possible to select which of these actuation sequences is particularly well suited to the specific object under investigation.

Once the actuation sequences and field distribution maps have been provided, the procedure enables selection of the actuation sequence to be used with relatively little computing effort, for example, within 5 or 10 seconds to two minutes. The necessary field distribution maps may be captured in a few tens of seconds, for example, within 40 seconds. The field distribution maps may thus be acquired and the computer-implemented method carried out immediately prior to playing out the actuation sequence, (e.g., acquisition of measurement data), wherein this only extends investigation time by one to two minutes, as a result of which the described procedure may also readily be used in day-to-day clinical practice.

At the same time, by taking account of the characteristics, (e.g., of the field distribution maps), of the object under investigation when selecting the actuation sequence to be used, measurement data acquisition is improved in comparison with using universal pulses. For example, a higher image quality or a better approximation of the achieved excitation distribution to a nominal excitation distribution is achieved. In addition, it may in any event be necessary for some measurement protocols for the necessary field distribution maps or at least parts thereof to be acquired before the measurement sequence is carried out, such that the additional time required for making the described selection of the actuation sequences to be used may still be less than the above estimate.

The actuation sequences may be ascertained in such a manner that, apart from the use of a different optimization parameter in the course of the optimization method, they are identically generated. In other words, the actuation sequences may differ exclusively with regard to the value of precisely one optimization parameter.

The optimization method may be carried out and/or the field distribution maps acquired as preparatory acts for the computer-implemented method, (e.g., outside the method itself), or also as part of the method. It is also possible for the different actuation sequences or the field distribution maps to be retrieved from a database, such that the respective ascertainment may begin distinctly before the start of the computer-implemented method.

The actuation sequence or the transmit signals may be ascertained in such a manner that parameters which parameterize a pulse shape are determined for the respective high-frequency transmit channel. In particular, these parameters may specify a complex envelope for a transmit signal with a given frequency. The complex envelope may in each case specify the amplitude and phase of the transmit signal for the respective high-frequency transmit channel continuously or quasi-continuously or discretely for individual points in the k-space.

Transmission may only proceed for specific k-space positions, wherein, between the individual transmission processes, gradient coils may be actuated, (e.g., by the actuation sequence), in order to modify the k-space position of the excitation. Such excitation at selected k-space points is known, for example, from the publication by M. A. Cloos et al. cited in the introduction. However, the actuation sequences may be ascertained by the optimization method in such a manner that high-frequency radiation is emitted continuously during excitation, e.g., by all the high-frequency transmit channels simultaneously. It is thus also possible to use actuation sequences which also provide emission of high-frequency radiation via at least one or all of the high-frequency transmit channels during energization of gradient coils for shifting the k-space position.

$B_1$ maps, which in each case state the spatial $B_1$ field distribution for a specific transmit coil, e.g., for a specific high-frequency transmit channel of the antenna arrangement, may be used as the field distribution maps. In other words, these $B_1$ maps describe the spatial sensitivity of the corresponding transmit coil. Additionally, or alternatively, a $B_0$ map may be used which represents the spatially resolved deviations of the main magnetic field from the actually desired homogeneous field profile. In other words, the $B_0$ map describes how far the Larmor frequency locally deviates from the desired Larmor frequency.

A provisional actuation sequence may be selected from the different actuation sequences. Depending on the field distribution maps and the provisional actuation sequence, it is possible to forecast an energy input into a selected region of the object under investigation in the event of the provisional actuation sequence being used for acquiring the measurement data, wherein the actuation sequence to be used or a new provisional actuation sequence is selected from the different actuation sequences depending on the forecast energy input. A provisional actuation sequence may in particular only be selected as the actuation sequence to be used if the forecast energy input is less than a limit value or is within a nominal or tolerance interval for energy input. An upper limit value may be ascertained based on International Electrotechnical Commission (IEC) SAR limit values and sequence or protocol parameters of the respective actuation sequence. A nominal or tolerance interval may be selected such that all energy inputs within this interval are below a limit value determined in this manner but not by more than a specific deviation, for example, a specified percentage deviation.

The actuation sequence may be determined iteratively. If, for example, it is established in the first pass that the provisional actuation sequence leads to an energy input which is greater than a limit value or is outside a nominal or tolerance interval, a new actuation sequence may be selected from the provisional actuation sequences and the energy input may be ascertained once again. This procedure may be repeated until the energy input for the current provisional actuation sequence is less than the limit value or is within the nominal or tolerance interval. The actuation sequence for which this is the case may be selected as the actuation sequence to be used.

If, for example, the energy input is within the nominal or tolerance range for a plurality of the provisional actuation sequences, the actuation sequence selected may that which is anticipated to provide optimum measurement data acquisition, wherein this sequence may be that one of the measuring sequences with the highest energy input which is still within the nominal or tolerance interval.

The different actuation sequences may be ranked depending on an anticipated energy input. For example, an energy input into at least one reference object under investigation, e.g., into a plurality of reference objects under investigation, may in each case be forecast for the different actuation sequences. The energy input or the average of these energy inputs may then be used to rank the different actuation sequences according to their anticipated energy input or according to a parameter which correlates therewith. If the energy input forecast for the provisional actuation sequence is outside the nominal or tolerance interval, this makes it possible, depending on whether it is above or below this interval, to ascertain the direction in the ranking in which the actuation sequence which is new or to be used is selected. As will be explained in greater detail below, selection may additionally be dependent on the severity of the deviation.

A similar procedure is also possible if only an upper limit value for energy input is specified. If the forecast energy input exceeds the limit value, a provisional actuation sequence with a lower energy input in the ranking may be selected. If the energy input is below the limit value, it may be verified whether this is also the case for a new provisional actuation sequence which is anticipated to have a somewhat higher energy input. It is thus possible to avoid, for example, using an actuation sequence with an unnecessarily low energy input which may result in suboptimal quality of the measurement data.

The initially selected provisional actuation sequence may be an actuation sequence for which, with regard to the reference object or objects under investigation, an energy input has been forecast which is within the nominal or tolerance interval or as close as possible below the limit value. Insofar as, depending on the field distribution maps, a similar energy input is obtained for the object under investigation as for the reference objects under investigation, this actuation sequence may thus directly be selected and provided as the actuation sequence to be used. If, in contrast, the energy input forecast depending on the field distribution maps differs from the energy input anticipated based on the reference objects under investigation, another of the different actuation sequences may be selected and verified as explained above.

The relevant region may be a region for which the highest energy is forecast. In particular, a respective forecast energy input may be ascertained for a plurality of regions in the object under investigation, wherein the actuation sequence to be used or the new provisional actuation sequence depending on the forecast energy input is selected in that one of the selected regions in which the forecast energy input is highest. The plurality of regions may be individual voxels or contiguous groups of voxels. The individual regions may be the virtual observation points already discussed above, as are explained in greater detail in the above-discussed article by G. Eichfelder et al. As explained therein, an upper limit for energy inputs occurring in the associated region may be ascertained for each virtual observation point. In the method, this upper limit may be forecast as an energy input for this region.

A local specific energy dose (SED) may be used as the energy input. This describes the energy input into an individual voxel or a defined region. It may be understood as the time integral over the local specific absorption rate. If the electric fields $E_c$ generated by the individual high-frequency transmit channels at position x are known, the SED value may be calculated as follows with the assistance of the local conductivity a and the local density p of the tissue:

$$SED(\vec{x}) = \int dt \frac{\sigma(\vec{x})}{2\rho(\vec{x})} \left\| \Sigma_c \vec{E_c}(\vec{x},t) \right\|_2^2$$

The local fields may be calculated depending on the control signals supplied to the individual high-frequency transmit channels by an electrodynamic simulation with the assistance of a body model. This does indeed permit an accurate determination of the electric fields and thus of the SED value. However, because a corresponding calculation is relatively demanding of computing effort and moreover no detailed electrodynamic model of the object under investigation may be available, in the method, the field distribution maps may advantageously be used for calculating the energy input, e.g., the SED value, for a respective provisional actuation sequence. The local magnetic field strengths B are known based on the field distribution maps and therefore the local electric fields E at position x may be calculated as follows with Maxwell's equations on the approximative assumption that the electric fields vary with the angular frequency co at which excitation also proceeds:

$$\vec{\nabla} \times \frac{\vec{B}(\vec{x})}{\mu_0} = i\omega\varepsilon(\vec{x})\vec{E}(\vec{x})$$

$\mu_0$ is here the magnetic permeability which may be at least approximately equated with the permeability of a vacuum. The only remaining unknown for calculating the electric fields E and thus also the SED value is thus the local permittivity $\varepsilon$. This may, however, likewise be ascertained from the $B_1$ maps. One possible way to achieve this is explained, for example, in the above-cited publication by X. Zhang, according to which, if phase angle is taken into account when acquiring the $B_1$ fields, local permittivity $\varepsilon_c$ may be ascertained from the complex values of the $B_1$ field by the following calculation:

$$\frac{\nabla^2 \tilde{B}_1}{\tilde{B}_1} = -\omega^2 \mu_0 \varepsilon_c$$

As is also apparent from the same publication, phase information in relation to $B_1$ fields may be reconstructed without additional measurement effort by solving an equation system which is dependent on the $B_1$ maps ascertained for the individual high-frequency channels. Because $B_1$ maps may have, in any event to be ascertained for each of the high-frequency transmit channels and each receiving antenna, the energy input, (e.g., an SED value), for the individual object under investigation may be ascertained without additional measurement effort or without any modification of the measurement device used.

The different actuation sequences may be results from an optimization method which involves minimizing a cost function. The cost function is a weighted sum of: (1) an energy input measure which relates to an anticipated energy input into a reference region of at least one reference object under investigation which is described by a respective reference data set in the event of an actuation sequence to be optimized being used, and (2) a deviation measure which relates to a deviation of an excitation distribution which is expected to be achieved in the reference object under investigation in the course of the actuation sequence from a nominal excitation distribution. In the cost function, the relative weighting of the energy input measure and the deviation measure is specified by the optimization parameter.

In other words, the optimization parameter weights how strongly the focus of optimization is on minimizing the energy input measure on the one hand or on minimizing the deviation measure on the other. In other words, for some of the actuation sequences, a higher value of the energy input measure is accepted in order to achieve greater optimization with regard to the deviation measure. Different actuation sequences are accordingly obtained for the same reference data sets depending on the specified optimization parameter. In particular, apart from the use of different values for the optimization parameter, the different actuation sequences are all ascertained in the same manner.

As a result of the explained optimization for different values of the optimization parameter, different actuation sequences are available from which a selection may be made as required. Thus, if an energy input during investigation of the object under investigation which exceeds a limit value is forecast for the provisional actuation sequence, it is possible to select another of the different actuation sequences in which the energy input measure was more strongly weighted in the course of optimization. As a result, a lower energy input may be expected to be achieved. On the other hand, in the event that a low forecast energy input is ascertained, another of the different actuation sequences may be selected in which the focus of optimization was more strongly on minimizing the deviation measure. As a result, it is possible in the course of admissible energy input to achieve an excitation distribution which is closer to a nominal excitation distribution.

The deviation measure may be ascertained as the standard deviation between the excitation distribution expected to be achieved and a nominal excitation distribution. The standard deviation may be calculated jointly for all the reference objects under investigation or separately for the individual objects under investigation. In the case of separate calculation, the sum or the average of these standard deviations, for example, may then be used as the deviation measure.

The above-explained SED value or another measure of the specific energy dose introduced into a reference object under investigation or a region of the reference object under investigation may in particular be used as the energy input measure. A separate value may firstly be calculated for each of the objects under investigation and these values may be summed or an average calculated.

Various approaches for ascertaining excitation distributions or anticipated energy inputs in the course of a measurement sequence are well known from the prior art and need not be explained in detail. The reference data sets may in each case specify a numerical body model for an electrodynamic simulation. It is also sufficient to specify field distribution maps for the respective reference object under investigation. Ascertaining an actuation sequence which minimizes the cost function may be a nonconvex optimization problem, such that it may be advantageous in the course of the optimization method to carry out the optimization method with a plurality of starting points in order to permit robust identification of a global minimum.

The optimization method may take account of a plurality of the reference objects under investigation. For each of the reference objects under investigation and each of the different actuation sequences, an individual energy input is ascertained which relates to an anticipated energy input into the reference region of this reference object under investigation in the event of this actuation sequence being used. For each of the different actuation sequences, a mean of the individual energy inputs is determined and assigned to the optimization parameter used for ascertaining the respective actuation sequence or to the actuation sequence itself. For example, account may be taken of 10-20 reference objects under investigation. It is, however, possible to take account of a larger or smaller number of reference objects under investigation.

It has been found that while energy inputs may indeed differ between different objects under investigation or reference objects under investigation in the event of the same actuation sequence being used, clear trends do occur in this connection. If, for example, a mean of the individual energy inputs for a first actuation sequence is obtained which is distinctly greater than the mean of the individual energy inputs for a second actuation sequence, it may be assumed, providing a sufficiently representative group of reference objects under investigation has been taken into account, that a higher energy input for the object under investigation will also be obtained from the first actuation sequence than from the second actuation sequence. As already mentioned above, it is thus possible to establish a ranking of the different actuation sequences with regard to the energy input anticipated therefrom. This makes it possible to select, as required, actuation sequences with a lower energy input or actuation sequences with a higher energy input, which may permit more uniform excitation.

A respective anticipated energy input may be ascertained for the respective actuation sequence for a plurality of regions of the respective reference object under investigation, wherein the largest of these anticipated energy inputs is selected as the individual energy input for this actuation sequence and this reference object under investigation. In other words, in each case that region for which the greatest energy input is ascertained may be selected as the reference region for each of the reference objects under investigation. Potential hotspots in which a particularly high energy input occurs are thus identified and taken into account. In this manner, it is possible to identify when a specific actuation sequence locally leads to a particularly high energy input in one or more regions and thus potentially to severe heating.

This is taken into account in the course of optimization because the energy input measure relates to an anticipated energy input into the reference region and thus the maximum energy input which occurs for any region. At the same time, actuation sequences which lead to corresponding hotspots in at least one of the reference objects under investigation result in the mean of the individual energy inputs being appreciably increased and this property may hence also be taken into account when selecting the provisional actuation sequence or the new provisional actuation sequence or the actuation sequence to be used. Because, as explained above, in the course of ascertaining the actuation sequence to be used, (e.g., a specific forecast energy input for the object under investigation itself is ascertained based on the provided field distribution maps), it is possible to discard during selection those actuation sequences which would lead to the formation of unacceptable hotspots for the specific object under investigation.

Depending on the means of the individual energy inputs assigned to the respective optimization parameters, it is possible to ascertain a functional relationship between the optimization parameters and the assigned means, wherein the actuation sequence to be used and/or the provisional and/or the new provisional actuation sequence are selected depending on this functional relationship. In particular, a polynomial relation may be ascertained as the functional relationship. The functional relationship may be ascertained by fitting or regression analysis. In the event of a relatively large number of different actuation sequences or values of the optimization parameter being used, the functional relationship may distinctly accelerate the identification of a suitable optimization parameter or a suitable actuation sequence.

For example, if an energy input for a provisional actuation sequence is forecast which exceeds a nominal value by a specific offset or scaling factor, an intermediate value may be calculated which is lower than the previous nominal value by this offset or scaling factor and an assigned value for the optimization parameter may be determined based on the functional relationship. The new provisional actuation sequence may then be selected such that its optimization parameter is as close as possible to the optimization parameter ascertained in this manner. A suitable actuation sequence may be ascertained within a few iteration acts by such a procedure.

The different actuation sequences may additionally in each case include actuation information for actuating at least one gradient coil for providing a gradient field. The actuation sequences may in each case describe a time profile of the gradient fields which, in the course of using the actuation sequence, is played out synchronously with the high-frequency pulses, (e.g., the transmit signals for the high-frequency transmit channels). The time profile of the gradient fields describes a k-space trajectory for excitation. The combination of gradient fields and high-frequency pulses for achieving more uniform excitation is well known from the prior art and need not be explained in detail. In one case, it would be possible to use the same k-space trajectory for all the actuation sequences. Because the used k-space trajectory and/or the actuation information for actuating the at least one gradient coil influence the resultant excitation distribution, such information is also taken into account in the optimization explained above. Using a fixed k-space trajectory may reduce the computing effort for optimization.

It may, however, be advantageous to use different actuation sequences with different actuation information, (in other words, actuation sequences which use different k-space trajectories), for actuating the at least one gradient coil. This does indeed mean that more free parameters are present in the course of optimization which may increase the computing effort for optimization.

Because the different actuation trajectories are ascertained by the optimization method in the method independently of data of the specific object under investigation and may therefore be ascertained upstream, it is possible to carry out an optimization method which demands very high computing power. The optimization method may be carried out on a computer cluster or mainframe computer and require a number of hours or days. This is possible because a corresponding optimization is required only once, after which the different actuation sequences may be used for a plurality of objects under investigation.

The different actuation sequences may be provided by the manufacturer of a magnetic resonance device or another service provider. The sequences may be stored on a magnetic resonance device, an external server, in a cloud, or the like and be provided as required.

In addition to the above-explained method for providing an actuation sequence to be used, the disclosure also relates to a method for acquiring measurement data of an object under investigation, in particular for medical imaging, by a magnetic resonance device, wherein transmit signals are emitted by an antenna arrangement of the magnetic resonance device in the course of measurement data acquisition via at least one high-frequency transmit channel, (e.g., via a plurality of high-frequency transmit channels), which signals are specified by an actuation sequence which is selected by the computer-implemented method for providing an actuation sequence to be used. The actuation sequence to be used may be provided in an upstream act and not be part of the method but may also be integrated as an additional act into the method.

As explained above, the actuation sequences may additionally include actuation signals for actuating at least one gradient coil for providing a gradient field. In this case, a control device of the magnetic resonance device may also make use of the corresponding actuation information to actuate at least one gradient coil for providing a gradient field.

The field distribution map may be acquired by the magnetic resonance device depending on the actuation sequence to be used. In particular, the field distribution maps may be acquired directly before measurement data acquisition or without repositioning of the object under investigation. For example, prior to measurement data acquisition, the field maps may firstly be acquired, for example, for approximately forty seconds. As has already been explained above, the computing time in the method for providing the actuation sequence is relatively low, such that the total time taken for acquiring the field maps and making the calculation may be only one to two minutes. At the same time, the provision of a plurality of different actuation sequences and the selection of the actuation sequence to be used depending on the field distribution maps does, however, provide that an excessively high energy input into the object under investigation may be robustly avoided. In addition, at an identical admissible energy input, any deviation of the achieved excitation distribution from a nominal excitation distribution may be distinctly reduced. The quality of measurement data acquisition, (e.g. image quality), is thus considerably improved.

In addition to the method, the disclosure also relates to a provision and/or magnetic resonance device configured to perform the computer-implemented method for providing an actuation sequence to be used and/or for carrying out the method for acquiring measurement data of an object under investigation.

If a provision device is exclusively intended to implement the computer-implemented method for providing an actuation sequence to be used, the provision apparatus may be a pure data processing device. General data processing devices may be appropriately programmed to provide a provision apparatus. Data processing may be carried out by a microprocessor, microcontroller, FPGA, or the like.

A corresponding data processing device may be integrated into an apparatus for measurement data acquisition, for example, a magnetic resonance device, or be constructed separately therefrom. Data processing may proceed locally or also on a server or in a cloud. A corresponding provision apparatus may also be designed to carry out the optimization method for ascertaining the different actuation sequences. This optimization method may be carried out on a separate device and the different actuation sequences may be provided in the course of installation or configuration of the provision apparatus, retrieved as required via a network connection, or the like.

The magnetic resonance device may include a control device which controls the antenna arrangement of the magnetic resonance device and optionally at least one gradient coil for providing a gradient field. The control device is designed to play out the actuation sequence to be used in order correspondingly to actuate the high-frequency transmit channels and optionally the at least one gradient coil.

In addition to the stated components, the magnetic resonance device may also include further conventional components of magnetic resonance devices, in particular a main magnet for providing a $B_0$ field, and an apparatus for positioning the object under investigation, etc.

The fundamental structure of magnetic resonance devices is well known in the prior art and therefore need not be explained in detail.

The disclosure additionally relates to a computer program for a data processing device having program statements which, when carried out on a data processing device, carry out the computer-implemented method for providing an actuation sequence to be used and/or the method for acquiring measurement data of an object under investigation. As has already been explained above, the data processing device may be a programmable device.

The disclosure additionally relates to a computer-readable data storage medium which includes a computer program.

BRIEF DESCRIPTION OF THE DRAWINGS

Further advantages and details of the present disclosure are revealed by the exemplary embodiments described below and with reference to the drawings.

DETAILED DESCRIPTION

Figure 1:
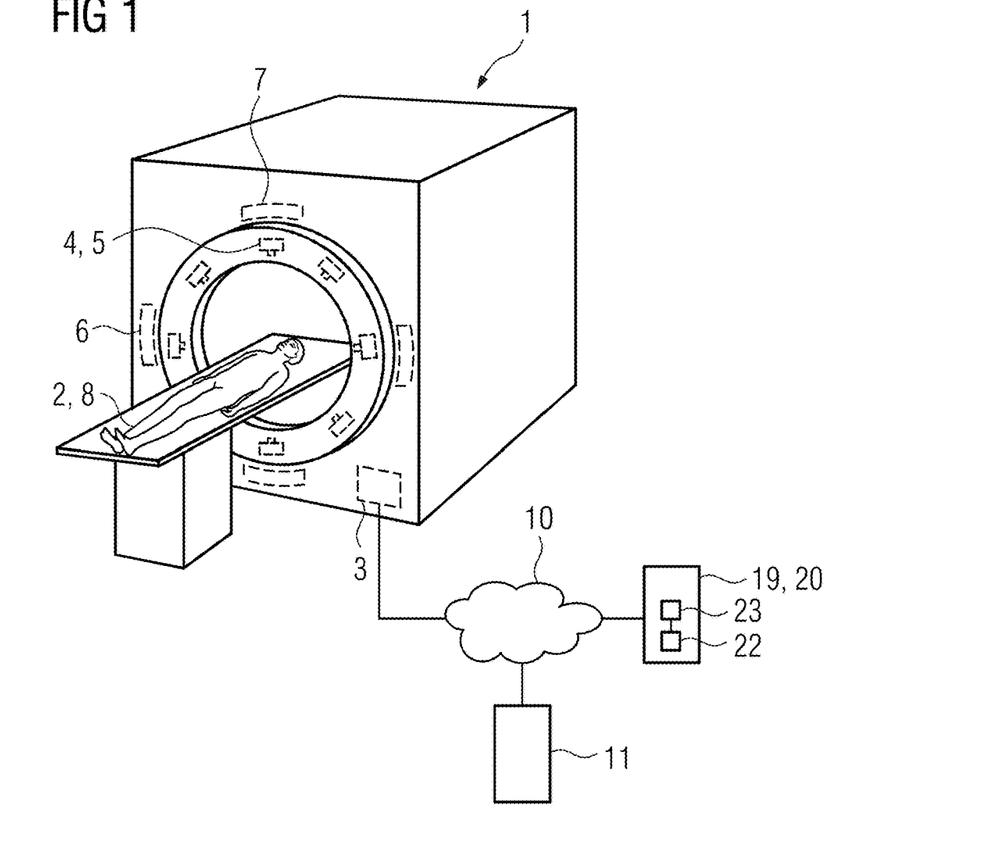
FIG. 1 depicts an exemplary embodiment of a magnetic resonance device configured to carry out an exemplary embodiment of a method for acquiring measurement data of an object under investigation, together with an exemplary embodiment of a provision device configured to perform an exemplary embodiment of the computer-implemented method for providing an actuation sequence to be used.

FIG. 1 shows a magnetic resonance device 1 which serves for acquiring measurement data of an object under investigation 2, in particular for imaging. The magnetic resonance device 1 includes a control device 3 which actuates a number of components of the magnetic resonance device according to a specific actuation sequence in order selectively to excite regions of the object 2 under investigation and acquire corresponding measurement data. Of these components, FIG. 1 shows by way of example an antenna arrangement 4 which in the example includes eight high-frequency transmit channels 5 for emitting high-frequency signals and so exciting spins in the object 2 under investigation. A plurality of gradient coils 6, 7 are additionally shown which serve to provide gradient fields superimposed on the main magnetic field $B_0$ generated by a main magnet (not shown here). The gradient coils 6, 7 may be actuated by the control device 3 based on actuation information which is part of the actuation sequence.

The control device 3 may actuate the individual high-frequency transmit channels 5 and in particular also the gradient coils 6, 7, e.g., by an actuation sequence which implements the principle of parallel excitation (pTx). The high-frequency transmit channels 5 and thus also the corresponding antennas or transmit coils are here simultaneously actuated with a certain time pattern, wherein a k-space is simultaneously or alternately sampled by the gradient coils 6, 7. One possible way of specifying such a sequence for a specified k-space trajectory, e.g., for a specified sequence of control signals for the gradient coils 6, 7, is to specify a complex envelope for each of the high-frequency transmit channels 5 which specifies an amplitude and phase of the transmit signal at each point in time. The envelope may be specified at a very high temporal resolution, e.g., quasi-continuously, or temporally spaced points may be specified.

It would in principle be possible to optimize an actuation sequence of the magnetic resonance device individually to the individual object 2 under investigation and its specific position in the magnetic resonance device 1. Due to the large number of possible parameters, this would however considerably extend the duration of an investigation, as a result of which such individual optimization is unlikely to be implementable in day-to-day clinical practice.

It has, however, been found that, in comparison with using the same actuation sequence for all objects under investigation, a considerable improvement in measurement data acquisition or imaging may already be achieved by individually selecting the actuation sequence to be used from a plurality of different specified actuation sequences.

A corresponding procedure is additionally explained below with additional reference to FIGS. 2 and 3. To facilitate understanding of the explained procedure various methods, which may also be used separately, and preparatory acts for this method are here explained together. However, because the various methods may also be carried out by different users on different devices, it is also possible to use the individual methods separately.

Figure 2:
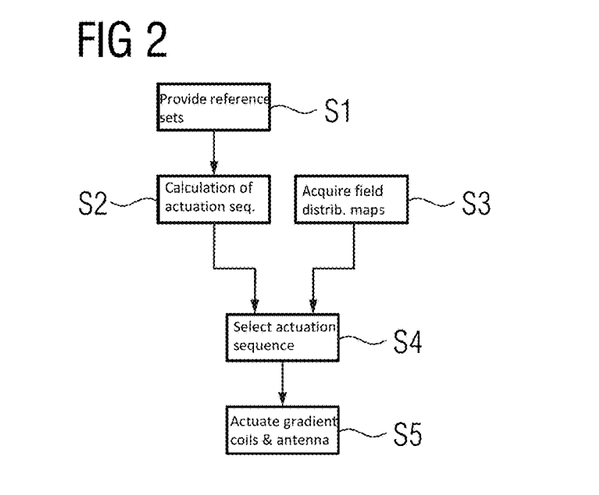
FIG. 2 depicts a flowchart of an exemplary embodiment of a method for acquiring measurement data of an object under investigation, in the course of which an exemplary embodiment of the computer-implemented method for providing an actuation sequence to be used is carried out.
Figure 3:
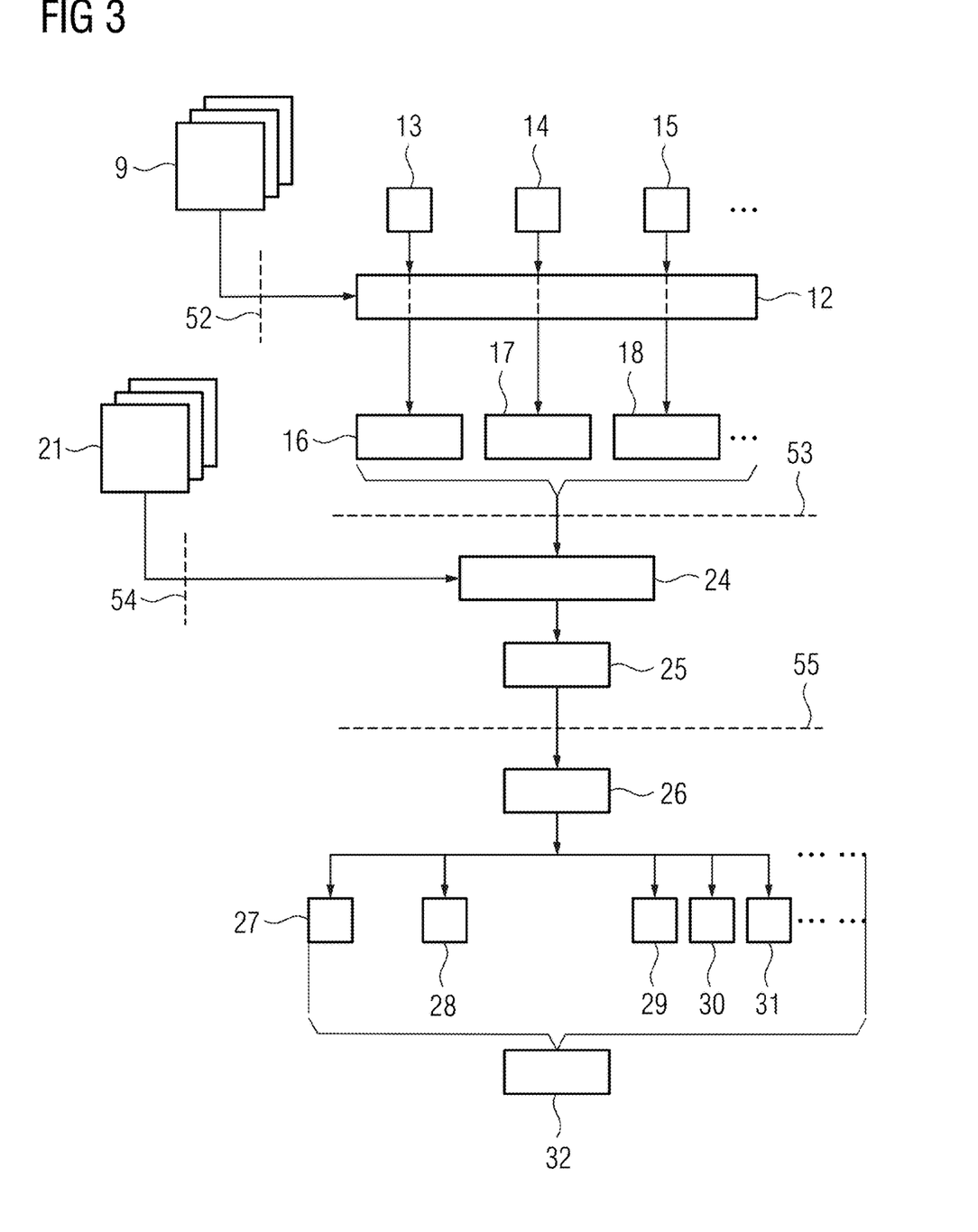
FIG. 3 depicts the data structures and algorithms used in the course of the method according to FIG. 2.

FIG. 2 shows a flowchart of the entire sequence for acquiring measurement data of an object 2 under investigation and FIG. 3 shows the data structure and algorithms used for this purpose. FIG. 1 shows the apparatuses which implement the corresponding acts.

In act S1, reference data sets 9 are provided which in each case relate to a reference object 8 under investigation. In the subsequent course of the method, the reference data sets are intended to make it possible, for a given actuation sequence, to determine an excitation distribution in the reference object under investigation and an energy input into at least one reference region of the object under investigation. The reference data sets may describe a detailed electrodynamic model of the respective reference object under investigation. It may, however, also be sufficient to provide field distribution maps, (e.g., $B_0$ and $B_1$ maps), of the respective reference object under investigation as the reference data set and based on this data to modify, for example, a specified electrodynamic model. The reference data sets may be captured by the same magnetic resonance device 1 by inspecting the respective reference object 8 under investigation instead of the object 2 under investigation. However, because the following optimization may be intended to be carried out by the manufacturer or by another service provider, it may be advantageous to capture corresponding reference data sets outside day-to-day clinical practice, for example, by using one or more magnetic resonance devices, (e.g., of like construction), to acquire the reference data sets or to acquire measurement data used as the basis for ascertaining the reference data sets.

As shown in FIG. 3, the reference data sets 9 are processed by an optimization method 12 which will be additionally described in detail below with reference to FIG. 4. It is noted here that the actuation sequences 16, 17, 18 ascertained by the optimization method 12 differ with regard to an optimization parameter 13, 14, 15 used when ascertaining the respective actuation sequence 16, 17, 18. Optimization may here in particular proceed with regard to a deviation measure which relates to a deviation of an excitation distribution which is expected to be achieved in the reference object 8 under investigation in the course of the respective actuation sequence 16, 17, 18 from a nominal excitation distribution and with regard to an energy input into a reference region of the reference objects 8 under investigation. The optimization parameter may specify which of these variables is the focus in the course of optimization.

Act S2, or the data processing shown between the dashed lines 52 and 53 in FIG. 3, may proceed as a preparatory calculation on an optimization device 11 which may be carried out once by the manufacturer.

Field distribution maps 21 with regard to the object 2 under investigation are acquired in act S3. $B_0$ and $B_1$ maps are in particular acquired here. With regard to the $B_1$ maps, it is possible to ascertain a $B_1$ map including phase information based on known transmit signals of the individual high-frequency transmit channels 5 and the receive signals received via the various antennas.

The different actuation sequences 16, 17, 18 ascertained by the optimization device 11 in act S2 and the field distribution maps 21 ascertained by the magnetic resonance device 1 in act S3 are transferred, in the example according to FIG. 1 via the network 10, to a provision device 19. In the example, the provision device 19 is a separate device. In alternative examples, the provision device 19 may be integrated into the magnetic resonance device 1 or into the optimization device 11. The provision device 19 is a data processing device 20 with a processor 23 and a memory 22. The memory 22 may have a computer program loaded into it which implements the computer-implemented method explained below for providing an actuation sequence to be used.

In act S4, the computer-implemented method 24 selects, depending on the field distribution maps 21, one of the different actuation sequences 16, 17, 18 as the actuation sequence 25 to be used and provides it, in the example via the network 10, to the control device 3 of the magnetic resonance device 1. As will be explained in greater detail below with reference to FIG. 5, an iterative procedure may here be provided. In the procedure, a provisional actuation sequence is selected, for which an energy input into the object 2 under investigation or into at least one region of the object 2 under investigation is forecast. If it is ascertained that this probable energy input is too high, (e.g., above a limit value or a tolerance interval), another of the different actuation sequences may be selected and this verification may be repeated. Also, in the event of an excessively low energy input, another of the provisional actuation sequences may be selected because the attempt may be made to improve the quality of measurement data acquisition by a higher but still admissible energy input.

The entire data processing in act S4, (e.g., the region in FIG. 3 between the lines 53, 54 and 55), may be carried out as a separate method independently of the further acts on a separate device, in the example on the provision device 19, for example by a service provider or the manufacturer of the magnetic resonance tomograph 1.

In act S5, the method 26 for acquiring measurement data of an object 2 under investigation is used in order to actuate the gradient coils 6, 7 and the antenna arrangement 4 by the control device 3 in accordance with the previously ascertained actuation sequence 25 to be used. The actuation information 27 here relates, for example, to the gradient coil 6, the actuation information 28 to the gradient coil 7 and the transmit signals, of which only the transmit signals 29, 30, 31 are shown by way of example, in each case relate to one of the high-frequency transmit channels 5. The measurement data 32 is acquired by playing out these actuation sequences 25.

Figure 4:
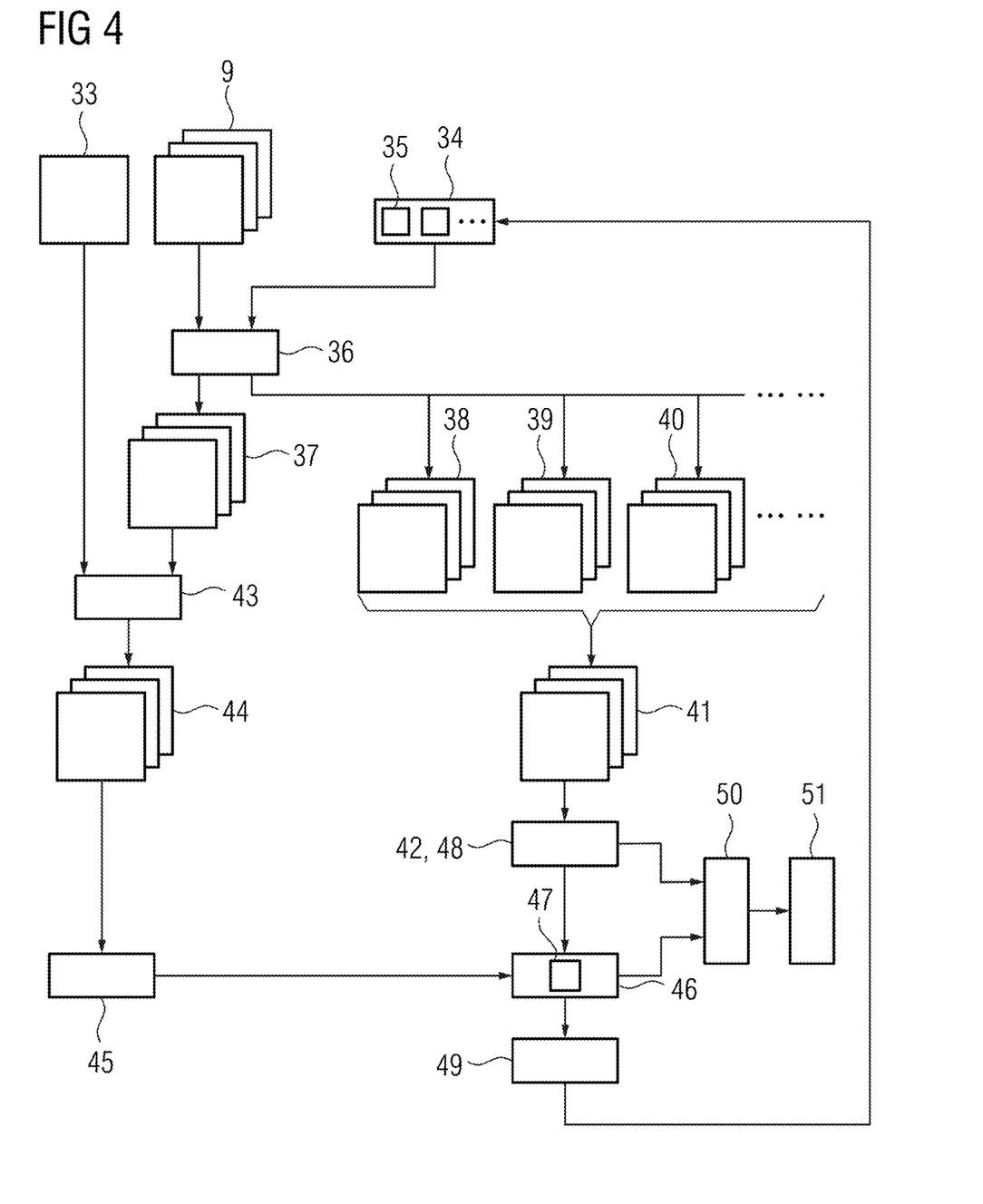
FIG. 4 depicts a detailed representation of the optimization algorithm used in FIG. 3.

FIG. 4 is a detailed representation of one possible way of implementing the optimization method 12 carried out in act S2. The reference data sets 9 and a nominal excitation distribution 33 are here used as input data for optimizing free parameters 35 of an actuation sequence 34 to be optimized. For reasons of clarity, FIG. 4 here specifies only one optimization for a single one of the optimization parameters 47. For other values of the optimization parameter, the explained procedure may then be carried out repeatedly or in parallel with a modified optimization parameter 13, 14, 15, 47. The actuation sequence 34 may be specified in time-discrete manner, wherein amplitudes and phases for the various high-frequency transmit channels 5 and gradient strengths for the gradient coils 6, 7 may be specified for each point in time. Other parameter settings and trajectories are also possible.

For each of the reference data sets 9, a simulation algorithm 36 ascertains an excitation distribution 37 which is expected to be achieved and would be expected to arise from playing out the actuation sequence 34 for the reference object 8 under investigation described by the respective reference data set 9. The simulation algorithm 36 additionally determines a respective anticipated energy input 38, 39, 40 for a plurality of regions of the reference object 8 under investigation which is described by the respective reference data set 9. As is known in principle from the prior art, the energy inputs may be determined based on an electrodynamic simulation or also based on field distribution maps.

Based on the anticipated energy inputs in the various regions, that region in which the highest energy input 38, 39, 40 is anticipated for each of the reference objects under investigation is selected as the reference region. The corresponding energy input, and thus the corresponding reference data set 9 and the correspondingly parameterized actuation sequence 34, is selected as an individual energy input 41 for the corresponding reference object under investigation. A mean 42 of the individual energy inputs 41 is then calculated.

The respective excitation distributions 37 expected to be achieved are compared by a comparison function 43 with the nominal excitation distribution 33 in order to determine a deviation measure 44 for each of the reference data sets 9. For example, the nominal excitation distribution 33 and the excitation distribution 37 expected to be achieved may be subtracted from one another and the standard deviation for this difference image may be calculated as the deviation measure 44. A mean deviation measure 45 may then be calculated for the deviation measures 44.

The intention is for an optimization process to jointly minimize the deviation measure 45 and an energy input measure 48, thus for example the mean 42. A cost function 46, which is a weighted sum of the deviation measure 45 and the energy input measure 48, is used for this purpose, wherein the weighting factors are specified by the optimization parameter 47. By selection of the optimization parameter 47, it is thus possible to establish a balance between optimization with regard to the energy input measure 48 and with regard to the deviation measure 45.

Depending on the value of the cost function 46, a modification algorithm 49 modifies the parameters 35 of the actuation sequence 34 and the method is repeated in order to optimize the parameters 35 iteratively. Known optimization methods, (e.g., a gradient descent method), may be used for this purpose. Optimization may be repeated for a specific number of passes or until a convergence criterion is met, for example, until a value of the cost function 46 no longer undergoes substantial change on successive passes.

The problem of optimizing the parameters 35 of the actuation sequence may be a nonconvex optimization problem. In order to avoid exclusively identifying a local optimum, the described procedure may be carried out repeatedly for each value of the optimization parameter 47, wherein various starting points, e.g., starting values, of the parameters 35 are used. That result which leads to the smallest value of the cost function 46 may then be used.

After completion of optimization for a plurality of optimization parameters 13, 14, 15, 47, a functional relationship 51 between a respective ascertained mean 42 of the individual energy inputs 41 and the respectively used optimization parameter 13, 14, 47 may be provided, (e.g., by a regression algorithm 50). This may serve, in the course of selection of the actuation sequence to be used, to select this or the provisional or new provisional actuation sequences used in the course of ascertainment, as will be explained in greater detail below.

Figure 5:
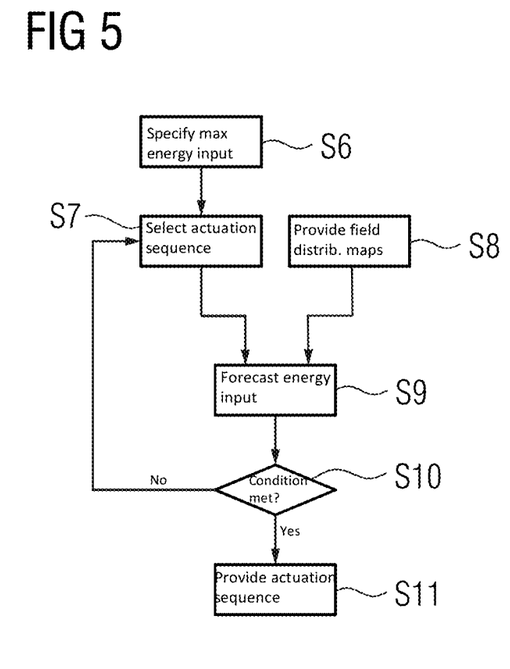
FIG. 5 depicts a flowchart of an exemplary embodiment of a computer-implemented method for providing an actuation sequence to be used.

FIG. 5 shows one possible implementation of act S4 in FIG. 2 or of the computer-implemented method 24 for providing an actuation sequence to be used.

Act S6 firstly specifies a maximum value for an admissible energy input into the object 2 under investigation. For example, an upper limit for the SED value may be specified. In particular, the limit value may be ascertained from the International Electrotechnical Commission (IEC) SAR limit values and the sequence or protocol parameters. SAR limit values are stated as limits to irradiated power and averaging over ten seconds or six minutes is involved. Based on these power limits, it is thus also possible to state limits for energy irradiated during the entire actuation sequence or during a portion of the actuation sequence.

In act S7, one of the actuation sequences is selected depending on the specified limit value or interval. If the functional relationship 51 between the mean 42 and the optimization parameter 13, 14, 15, 47 is known, an optimization parameter and thus also an assigned actuation sequence may be directly selected which has an average energy input for the reference objects under investigation of below the limit value or in the specified interval. If, in contrast, means of the individual energy inputs are directly assigned to the actuation sequences, it is also possible in this case too to directly select an actuation sequence for which the mean of the individual energy inputs is less than the limit value or is in the interval. It might in principle also be possible to select the provisional actuation sequence in another manner, for example randomly.

Act S8 provides the field distribution maps, (e.g., $B_0$ and $B_1$ maps), for the object 2 under investigation. The field distribution maps may be received from any desired source, for example, read out from a database, via an interface of a device which is implementing the method. It is, however, also possible to acquire the field distribution maps within the method itself.

Act S9 forecasts an energy input into a selected region of the object under investigation in the event of the provisional actuation sequence selected in act S7 being used. As has already been explained with reference to FIG. 4 for ascertaining energy inputs into reference objects under investigation, an energy input into a plurality of different regions of the object under investigation may initially be forecast. The previously explained virtual observation points may be used here, namely an energy input into regions which are not necessarily contiguous but are anticipated to behave similarly is calculated. That region into which the greatest energy input proceeds may then be selected and this energy input may be used in act S10 in order to decide whether a condition of use is met.

If the condition of use is met in act S10, this in particular being the case when the energy input is less than a limit value or is within a specified interval, the method is continued in act S11 by selecting and providing the provisional actuation sequence specified in act S7 as the actuation sequence to be used.

Otherwise, the method is repeated from act S7. A new provisional actuation sequence is selected in act S7. It is, in principle, possible to select the new, provisional actuation sequence randomly. Account may be taken of the direction in which and how far the energy input determined in act S9 deviates from the limit value or the interval. This may lead to considerably faster ascertainment of an actuation sequence in the desired energy input interval or below the limit value.

The functional relationship 51 between the optimization parameters and the assigned means 42 of the individual energy inputs 41, the provision of which has been explained with reference to FIG. 4, may here in particular be used. If, for example, it has been ascertained that the forecast energy input for the provisional actuation sequence is larger or smaller by a specific offset or factor than the mean of the individual energy inputs for this actuation sequence, the limit value or interval limit may be corrected by this factor or offset in order to determine modified nominal energy input values. Based on the functional relationship 51, a nominal value for the optimization parameter may be determined from this modified nominal energy input value. It is thus possible to select an actuation sequence which has an optimization parameter which is as close as possible to this nominal optimization parameter. Even in the event of a large number of different actuation sequences, for example some tens or hundreds of actuation sequences, being used, the actuation sequence to be used may be ascertained within a few iterations by the described procedure.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

Although the disclosure has been illustrated and described in greater detail with reference to the exemplary embodiments, the disclosure is not restricted by the disclosed examples and other variations may be derived therefrom by a person skilled in the art without departing from the scope of protection of the disclosure.

The invention claimed is:

1. A computer-implemented method for providing an actuation sequence specifying transmit signals to be emitted for at least one high-frequency transmit channel of an antenna arrangement of a magnetic resonance device for acquiring measurement data of an object under investigation by the magnetic resonance device, the method comprising:
   providing different actuation sequences, wherein each actuation sequence of the different actuation sequences is a result of an optimization method, and wherein the different actuation sequences differ from each other with regard to a value of an optimization parameter taken into account in the optimization method;
   providing a plurality of field distribution maps acquired by the magnetic resonance device or a further magnetic resonance device from the object under investigation;
   selecting a provisional actuation sequence from the different actuation sequences;
   forecasting an energy input into a selected region of the object under investigation based on the field distribution maps and the provisional actuation sequence;
   selecting the actuation sequence to be used or a new provisional actuation sequence from the different actuation sequences depending on the forecast energy input; and
   providing the selected actuation sequence to be used or the new provisional actuation sequence.

2. A method for acquiring measurement data of an object under investigation for medical imaging, by a magnetic resonance device, the method comprising:
   providing different actuation sequences, wherein each actuation sequence of the different actuation sequences is a result of an optimization method, and wherein the different actuation sequences differ from each other with regard to a value of an optimization parameter taken into account in the optimization method;
   providing a plurality of field distribution maps from the object under investigation;
   selecting a provisional actuation sequence from the different actuation sequences;
   forecasting an energy input into a selected region of the object under investigation based on the field distribution maps and the provisional actuation sequence;
   selecting the actuation sequence to be used from the different actuation sequences depending on the forecast energy input; and
   emitting transmit signals by an antenna arrangement of the magnetic resonance device during a measurement data acquisition via at least one high-frequency transmit channel, wherein the transmit signals are specified by the selected actuation sequence.

3. A device comprising:
   a processor; and
   a memory coupled to the processor, wherein the memory and the processor are configured to:
      provide different actuation sequences, wherein each actuation sequence of the different actuation sequences is a result of an optimization method, and wherein the different actuation sequences differ from each other with regard to a value of an optimization parameter taken into account in the optimization method;
      provide a plurality of field distribution maps acquired by the device from an object under investigation;
      select a provisional actuation sequence from the different actuation sequences;
      forecast an energy input into a selected region of the object under investigation based on the field distribution maps and the provisional actuation sequence;

select the actuation sequence to be used or a new provisional actuation sequence from the different actuation sequences depending on the forecast energy input; and provide the selected actuation sequence to be used or the new provisional actuation sequence.

4. The computer-implemented method of claim 1, wherein the plurality of field distribution maps comprises at least one $B_0$ map, at least one $B_1$ map, or a combination thereof.

5. The computer-implemented method of claim 1, wherein a respective forecast energy input is ascertained for a plurality of regions of the object under investigation, wherein a region of the plurality of regions for which the forecast energy input is highest is selected, and wherein the actuation sequence to be used or the new provisional actuation sequence is selected depending on the forecast energy input into the selected region.

6. The computer-implemented method of claim 5, wherein the different actuation sequences are results of the optimization method in which a cost function is minimized, wherein the cost function is a weighted sum of:

an energy input measure relating to an anticipated energy input into a reference region of at least one reference object under investigation described by a respective reference data set in event of an actuation sequence to be optimized being used, and a deviation measure relating to a deviation of an excitation distribution expected to be achieved in the reference object under investigation during the actuation sequence from a nominal excitation distribution, and wherein the relative weighting of the energy input measure and the deviation measure is specified by the optimization parameter.

7. The computer-implemented method of claim 6, wherein the optimization method takes account of a plurality of reference objects under investigation, wherein, for each reference object of the plurality of reference objects under investigation and each actuation sequence of the different actuation sequences, an individual energy input is ascertained which relates to an anticipated energy input into the reference region of the respective reference object under investigation in event of the respective actuation sequence being used, and wherein, for each actuation sequence of the different actuation sequences, a mean of the individual energy inputs is determined and assigned to the optimization parameter used for ascertaining the respective actuation sequence or to the actuation sequence itself.

8. The computer-implemented method of claim 7, wherein a respective anticipated energy input is ascertained for the respective actuation sequence for a plurality of regions of the respective reference object under investigation, and wherein a largest of the anticipated energy inputs ascertained is selected as the individual energy input for this actuation sequence and the respective reference object under investigation.

9. The computer-implemented method of claim 8, wherein, depending on the individual energy inputs assigned to the respective optimization parameters, a functional relationship is ascertained between the optimization parameters and the assigned energy inputs, and wherein the actuation sequence to be used, the provisional actuation sequence, the new provisional actuation sequence, or a combination thereof is/are selected depending on the ascertained functional relationship.

10. The computer-implemented method of claim 7, wherein, depending on the individual energy inputs assigned to the respective optimization parameters, a functional relationship is ascertained between the optimization parameters and the assigned energy inputs, and wherein the actuation sequence to be used, the provisional actuation sequence, the new provisional actuation sequence, or a combination thereof is/are selected depending on the ascertained functional relationship.

11. The computer-implemented method of claim 1, wherein the different actuation sequences are results of the optimization method in which a cost function is minimized, wherein the cost function is a weighted sum of:

an energy input measure relating to an anticipated energy input into a reference region of at least one reference object under investigation described by a respective reference data set in event of an actuation sequence to be optimized being used, and a deviation measure relating to a deviation of an excitation distribution expected to be achieved in the reference object under investigation during the actuation sequence from a nominal excitation distribution, and wherein the relative weighting of the energy input measure and the deviation measure is specified by the optimization parameter.

12. The computer-implemented method of claim 11, wherein the optimization method takes account of a plurality of reference objects under investigation, wherein, for each reference object of the plurality of reference objects under investigation and each actuation sequence of the different actuation sequences, an individual energy input is ascertained which relates to an anticipated energy input into the reference region of the respective reference object under investigation in event of the respective actuation sequence being used, and wherein, for each actuation sequence of the different actuation sequences, a mean of the individual energy inputs is determined and assigned to the optimization parameter used for ascertaining the respective actuation sequence or to the actuation sequence itself.

13. The computer-implemented method of claim 12, wherein a respective anticipated energy input is ascertained for the respective actuation sequence for a plurality of regions of the respective reference object under investigation, and wherein a largest energy input of the anticipated energy inputs ascertained is selected as the individual energy input for this actuation sequence and the respective reference object under investigation.

14. The computer-implemented method of claim 13, wherein, depending on the individual energy inputs assigned to the respective optimization parameters, a functional relationship is ascertained between the optimization parameters and the assigned energy inputs, and wherein the actuation sequence to be used is selected depending on the ascertained functional relationship.

15. The computer-implemented method of claim 12, wherein, depending on the individual energy inputs assigned to the respective optimization parameters, a functional relationship is ascertained between the optimization parameters and the assigned energy inputs, and wherein the actuation sequence to be used is selected depending on the ascertained functional relationship.

16. The computer-implemented method of claim 1, wherein the different actuation sequences in each case further comprise actuation information for actuating at least one gradient coil for providing a gradient field.

17. The method of claim 2, wherein the field distribution maps are acquired by the magnetic resonance device.

18. The device of claim 3, wherein the device is a magnetic resonance device.

* * * * *